United States Patent [19]

Nagasawa

[11] Patent Number: 5,399,983
[45] Date of Patent: Mar. 21, 1995

[54] PROBE APPARATUS

[75] Inventor: Yasushi Nagasawa, Yamanashi, Japan

[73] Assignee: Tokyo Electron Yamanashi Limited, Nirasaki, Japan

[21] Appl. No.: 264,195

[22] Filed: Jun. 22, 1994

Related U.S. Application Data

[63] Continuation of Ser. No. 924,972, Aug. 5, 1992, abandoned.

[30] Foreign Application Priority Data

Aug. 8, 1991 [JP] Japan .................. 3-199508

[51] Int. Cl.$^6$ .............................................. G01R 1/04
[52] U.S. Cl. ................................................ 324/758
[58] Field of Search ........................ 324/458, 756–760

[56] References Cited

U.S. PATENT DOCUMENTS

| | | | |
|---|---|---|---|
| 4,195,259 | 3/1980 | Reid et al. | 324/158 P |
| 4,755,747 | 7/1988 | Sato | 324/158 F |
| 5,065,103 | 11/1991 | Slinkman et al. | 324/458 |
| 5,177,438 | 1/1993 | Littlebury et al. | 324/158 P |

*Primary Examiner*—Kenneth A. Wieder
*Assistant Examiner*—Barry C. Bowser
*Attorney, Agent, or Firm*—Oblon, Spivak, McClelland, Maier & Neustadt

[57] ABSTRACT

A semiconductor probe method and apparatus for avoiding collision between probe and semiconductor. A method of the present invention includes the step of setting a probe card adjacent a semiconductor wafer which is to be tested. A reading location data step then reads semiconductor wafer location data. A high speed advancing step then moves the probe card and semiconductor wafer together at a sufficiently high speed. A low speed advancing step then moves the probe card and semiconductor wafer together at a low speed. Finally, a detecting step detects when probe card needles contact the semiconductor wafer, at which point, the engaging operation is stopped and contact point data is stored in memory. A probe apparatus includes a probe card holder for supporting a probe card including probe needles. A memory element is arranged on the probe card and contains data of the position of the probe needles. Supporting means are provided for supporting a semiconductor wafer having a plurality of electrode pads, and for vertically moving the wafer. A control system for attaining a level of the probe needles of the probe card based on data read from the memory element of the probe card holder is also provided. The control system drives the supporting means at a high speed, then at a low speed such that the electrode pads of the wafer approach the tips of the probe needles while avoiding a collision.

11 Claims, 7 Drawing Sheets

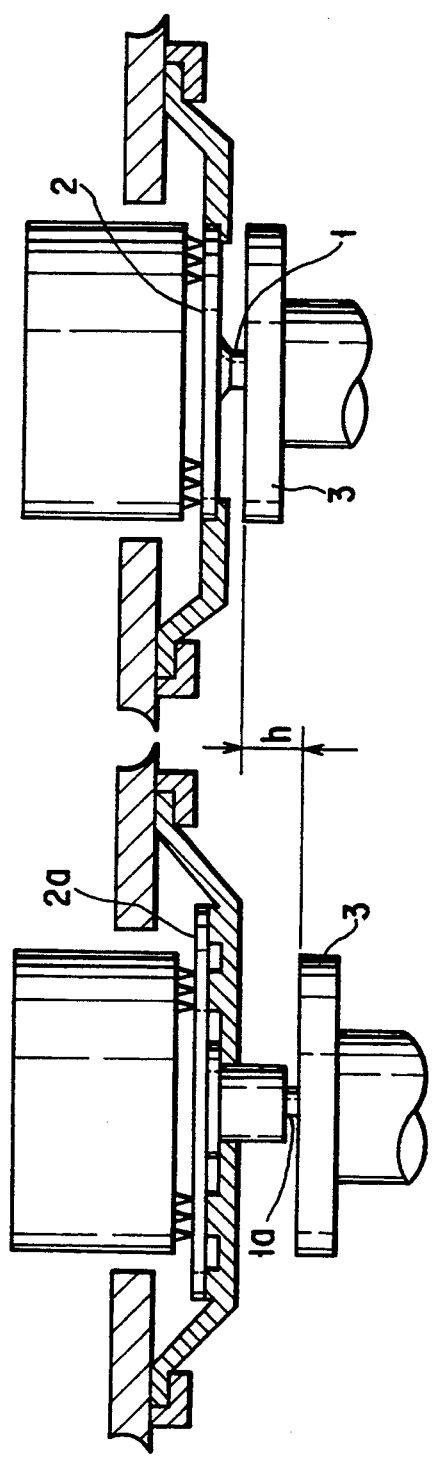

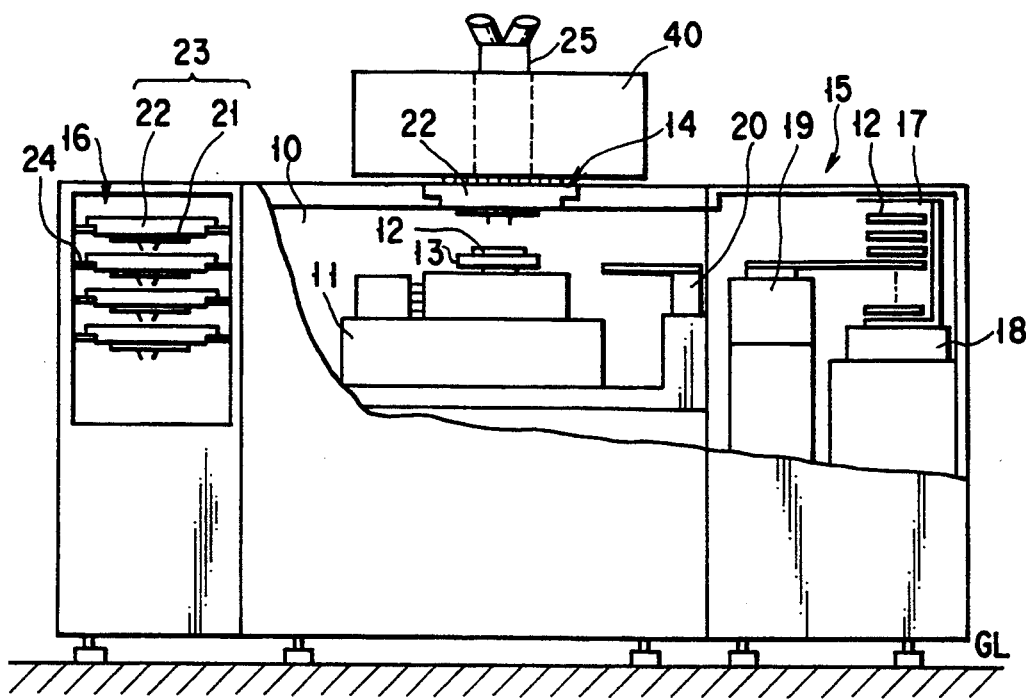
F I G. 3
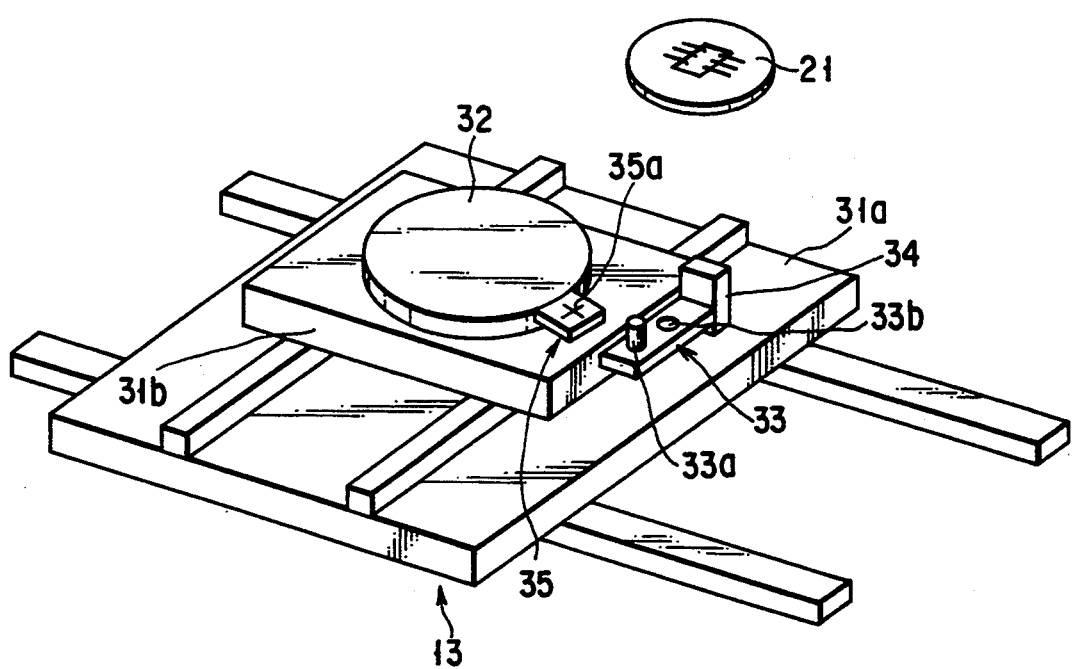
F I G. 4

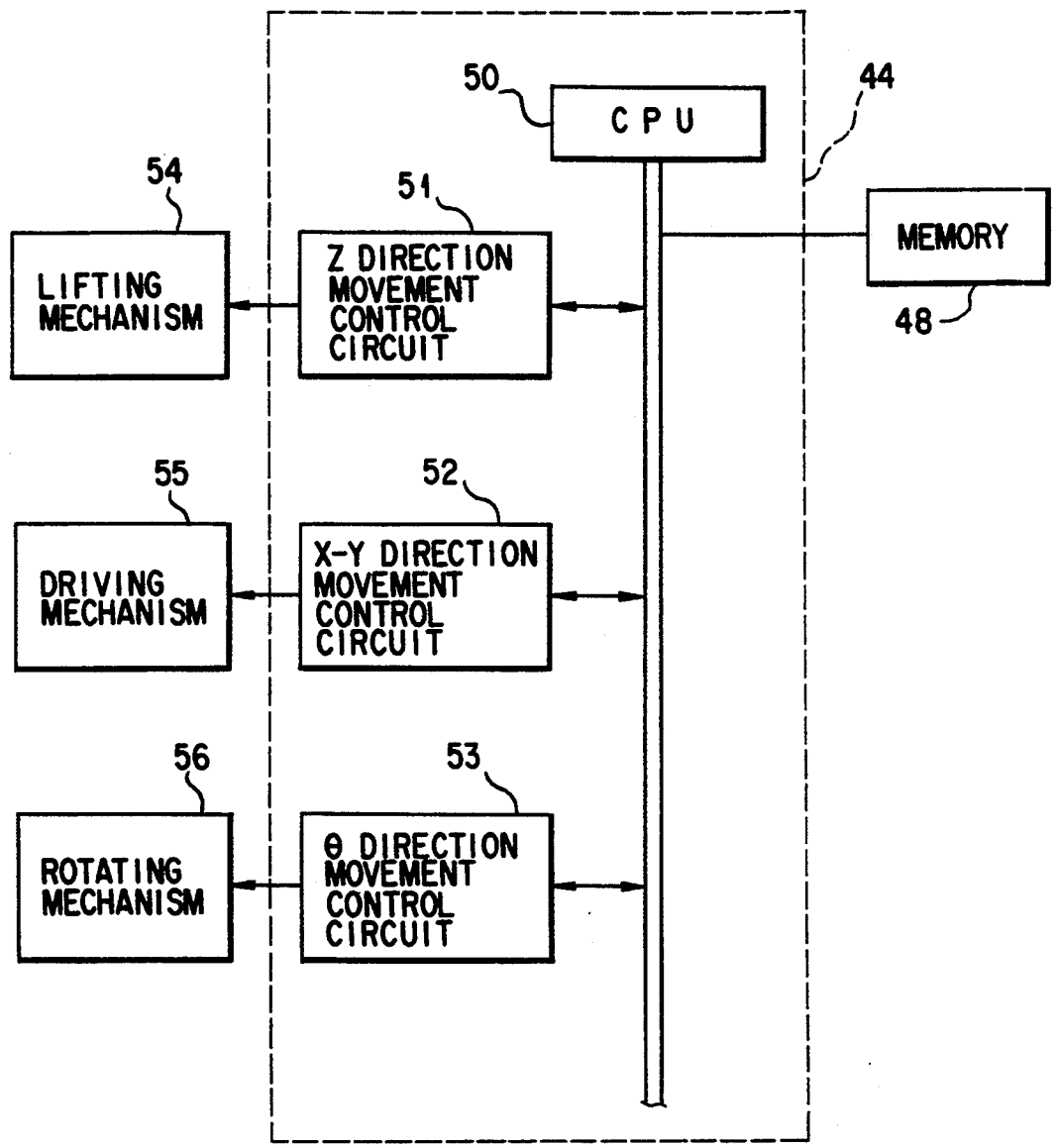
F I G. 7

PROBE APPARATUS

This application is a continuation of application Ser. No. 07/924,972, filed on Aug. 5, 1992, now abandoned.

BACKGROUND OF THE INVENTION

1. Field of the Invention

The present invention relates to a probe apparatus for examining electrical characteristics of an object such as a semiconductor device.

2. Description of the Related Art

As known, in production of the semiconductor device, a large number of semiconductor devices are formed on a semiconductor wafer by use of the precision photographical transcription technique, or the like, and the wafer is cut down into the respecting semiconductor devices. According to the current technique, in order to improve the productivity of the semiconductor device, the electrical characteristics of each of the semiconductor devices are examined while they are still half-complete products in the form of a semiconductor wafer, by a probe apparatus, and only those which are judged to be good in the examination are carried onto the next step, for example, packaging process.

Such a probe apparatus comprises a wafer holding table movable in X-Y-Z-$\theta$ directions above the wafer holding Table A probe card having probes, the number of which corresponds to that of the electrode pads of the semiconductor device, is positioned adjacent to the semiconductor device. Test examination of a semiconductor device is carried out in the following manner. A semiconductor wafer is placed on the wafer holding table, and this wafer holding table is moved such as to bring the probes, which is connected to a tester, into contact with the electrodes of a semiconductor device.

With the probe apparatus of this type, since the level of the tips of probe needles differ from one probe card to another, the level of the tips of the probe needles of a probe card must be known before the start of a test examination. Thus, the semiconductor wafer on the table is lifted a very low speed, for example 500 micrometers/second, to detect the level (contact point) where the tips of the probe needles touch on the semiconductor wafer. In this step of detecting the level of the tips of probe needles, the wafer holding table is lifted at a speed so slow from the home position (the lowest position) that it takes an extremely long time to find the contact point. To save time, the semiconductor wafer is lifted at a high speed up to a safe point where it does not yet reach the tip of the probe, and then at a low speed until it touches on the tip.

Recently, in accordance with increase in the degree of integration of semiconductor devices, the number of the electrode pads of a semiconductor device has been increased, and the pitch between neighboring pads has been narrowed. In order to follow this tendency development of a probe card 2a in which probe needles 1a are arranged substantially vertical, as shown in FIG. 2, is proceeded to achieve practical use thereof, in place of a probe card 2 in which probe needles 1 are diagonally arranged as shown in FIG. 1. However, with the probe card 2a in which the probe needles 1a are substantially vertically arranged, the tips of the probe needles will be located much (about some centimeters) lower (indicated by letter h in FIG. 2) than the case of the conventional probe card 2, when the card is fixed to the probe apparatus. Consequently, in this step of detecting the level of the tips of probe needles, the lifting distance of a wafer holding table 3 for holding a semiconductor wafer or the like must be set smaller than usual. In case where the distance is erroneously set, an object such as a semiconductor device is likely to collide with the probe needles while detecting the level of the tips of the probe needles, damaging the semiconductor wafer (object) and/or the probe card.

SUMMARY OF THE INVENTION

Therefore, the object of the invention is to provide a probe apparatus which can surely avoid the collision between an object to be examined and probe needles so as to prevent damage of the object as well as the probe card, etc.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 and 2 each show the level of the tips of conventional probe needles, illustrating the difference in level as the two figures compared with each other;

FIG. 3 is a diagram showing the structure of an overall probe apparatus according to an embodiment of the invention;

FIG. 4 is a schematic view of the measurement table shown in FIG. 2;

FIG. 7 is a block diagram of the control system for the measurement table;

DETAILED DESCRIPTION OF THE PREFERRED EMBODIMENTS

Figure 5:
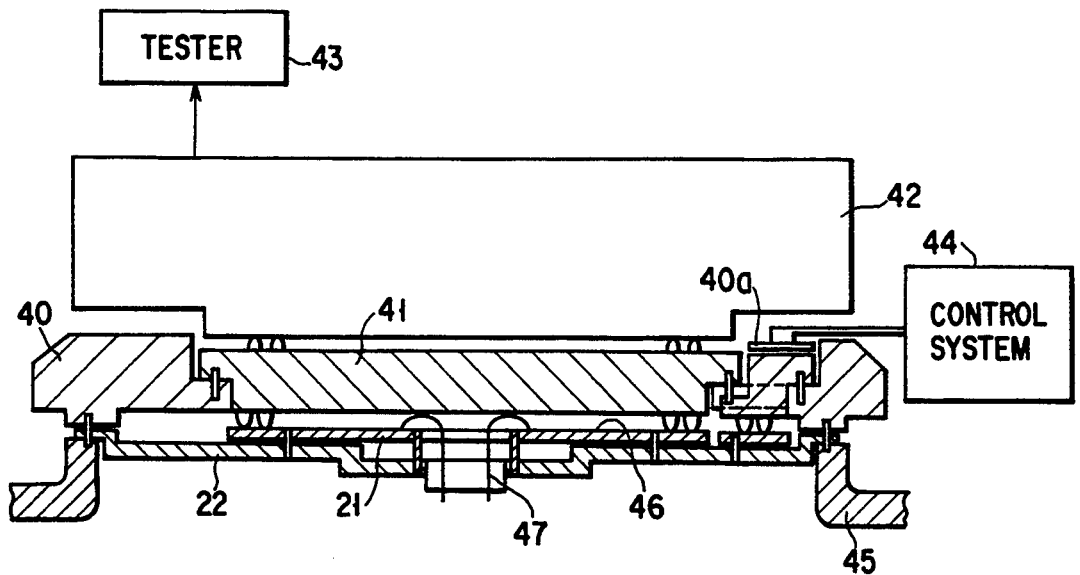
FIG. 5 is a side view of the probe mechanism shown in FIG. 2.

An embodiment, in which the present invention is applied to a probe apparatus for examining semiconductor devices formed on a wafer, will now be described with reference to drawings.

The following is a brief explanation of the structure of the probe apparatus overall with reference to FIG. 3.

FIG. 3 illustrates a main body 10 of the probe apparatus, in which a main stage 11 is located at substantially the center of the main body. Further, a measurement table 13 (later described) for placing a semiconductor wafer 12 thereon, is provided for the main stage 11, which is movable in the X and Y directions in a horizontal plane, along with the measurement table 13. Above the measurement table 13, located is a probe mechanism 14, which will be described later. Although not shown in the figure, an alignment unit is provided at the center on the front side of the main body 10. The alignment unit includes a camera for alignment as an image recognition device. For alignment, the table 13 is moved to a level below the camera.

An auto-loader 15 and a probe card exchanger 16 are provided respectively on the right and left sides of the main body 10.

In the auto-loader 15, an exchangeable wafer cassette 17 in which a number of semiconductor wafers 12 are stacked one above another with a constant interval therebetween, is placed on a cassette mount table 18. Between the wafer cassette 17 and the table 13, there are provided a loader stage 19 movable in a horizontal plane, and a wafer handling arm 20 which can be driven by a Y-direction driving mechanism (not shown) and Z-direction driving mechanism (not shown). In order to examine a semiconductor wafer 12 by the probe, the wafer is conveyed by the loader stage 19 close to the table 13, and then placed on the table by the handling arm 20. After the examination, the wafer is moved onto the loader stage 19 by the handling arm 20, and transferred to the wafer cassette 17 by means of the loader stage 19.

In the meantime, a plurality of assemblies (or probe card means 23) each made by fitting a probe card 21 into a card holder 22, are stacked one above another with a certain interval therebetween, in a store shelf 24.

On the main body, there is provided a microscope or TV camera 25 for observing the wafer placed on the table 13, as well as the tip of the probe needles of a probe card 21, through an opening made at the center portion of each of the probe card 21 and card holder 22.

The automatic probe exchange operation employed in the above-described probe apparatus is the same as that set forth in U.S. Pat. No. 4,966,520, for example.

The following is a further explanation of the table 13 with reference to FIG. 4.

The table 13 includes an X stage 31a movable along a set of rails running in the X direction, and a Y stage 31b movable along a set of rails running on the X stage 31a in the Y direction. The X and Y stages 31a and 31b are driven in the X and Y directions, respectively, by means of a widely-used driving mechanism including a pulse motor. A chuck 32 mounted on the Y stage 31b is moved in the vertical direction (Z direction) by a widely-used lifting mechanism, and also rotated around the imaginary line passing through the center of itself, and running in parallel with the Z axis, by means of a widely-used rotating mechanism. In FIG. 7, reference numerals 54, 55 and 56 respectively show the aforementioned driving mechanism, lift mechanism, and rotating mechanism, each of which is controlled by a control mechanism described later.

A lifting mechanism 34 is fixed to the side of the Y stage 31b, and a mobile camera 33 movable in the vertical direction is held in the lifting mechanism 34. The mobile camera 33 includes a high magnification portion 33a and a low magnification portion 33b.

A strip 35 is fixed to the side of the chuck 32 such as to project horizontally in its radial direction. The strip 35 is made of a transparent small piece having a surface on which formed is a target 35a defined by the intersection of a cross marked with a conductive thin film such as ITO (indium tin oxide) thin film, or chrome. The target 35a serves as a reference point during a detection by the camera 33. Further, a conductive transparent thin film, for example, an ITO thin film is provided around the cross-shaped thin film such as to cover it, and the conductive transparent thin film enables detection of the level (in the Z direction) by use of a capacity sensor.

As the chuck 32 rotates, the strip 35 on which the target 35a is marked can move to the position through which the optical axis of the high magnification portion of the mobile camera 33 passes, and moves out of the position. Here, it is possible to set the strip 35 movably on the chuck 32.

The details of alignment of a wafer by use of the table 13 having the above-mentioned structure, are explained in the U.S. application by Ryuichi TAKEBUCHI based on Japanese Patent Application Nos. 3-216067 and 3-216068 filed Aug. 1, 1992, and therefore will be omitted.

The probe card/card holder assembly 23 will be explained in detail with reference to FIGS. 5 and 6.

As can be seen in FIG. 5, an insert ring 40 is set on the upper portion of the main body 10 (see FIG. 3), and a contact ring 41 is engaged with the stepped portion of the inner side surface of the insert ring (enter opening). The set position for the contact ring 41 is determined by two alignment pins provided away from both rings 40 and 41 in the radial direction of each ring. On the upper surface of the test ring 41, provided is a test head 42 such as to electrically connect them to each other via contact pieces arranged therebetween. The test head 42 is electrically connected to a known tester 43 so as to supply output signals thereto, and so is a print substrate 40a of the insert ring 40 to the control system 44 described later. A support ring 45 is provided in the main body 10 movably in the vertical direction. The periphery of the card holder 22 is interposed between the head portion of the support ring 45 and the insert ring 40, and the assembly 23 exchangeably set underneath the contact ring 41. The assembly 23 can be set to a predetermined position by two alignment pins located between the insert ring 40 and the card holder 22, and between the card holder 22 and the support ring 45.

A substrate 46 consisting of, for example, a print board, is placed on the upper surface of the probe card 21, and a number of probe needles 47 are arranged substantially vertically downward such that they correspond to electrode pads of semiconductor devices on the semiconductor wafer 12. It should be noted here that the probe needles 47 may be arranged to correspond to electrode pads of a semiconductor device, or to electrode pads of a plurality of semiconductor devices. The probe needles 47 extend vertically downward through the center opening of the card holder 22, and project their ends by a small portion from the bottom surface of the cylindrical block also projecting from the bottom surface of the card holder 22. The print substrate set on the upper surface of the probe card 21 is electrically connected to contact pieces projecting from the lower surface of the contact ring 41, as the assembly 23 is fit into the main body 10. Consequently, the print substrate, and the probe needles 47 are electrically connected to the tester 43 via the test head 42.

Figure 6:
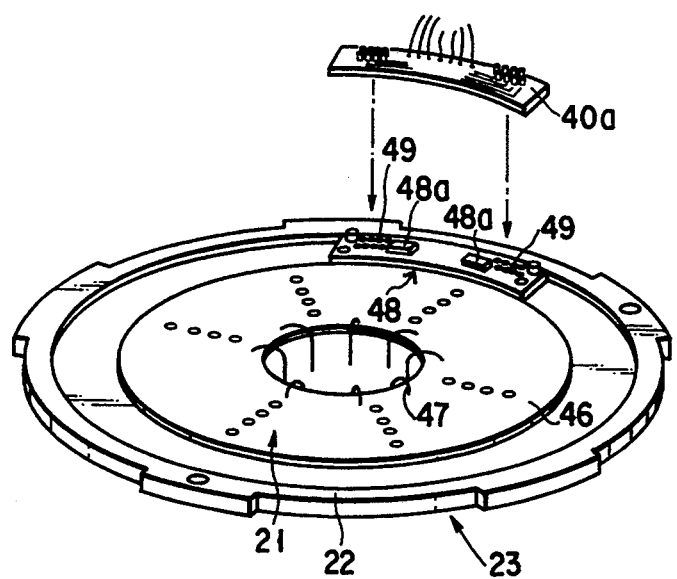
FIG. 6 is a schematic view of a part of the probe mechanism.

As shown in FIG. 6, memory means 48 (first memory means) and electrical connection means 49 are provided on the upper surface of the probe card/card holder assembly 23. It should be pointed out that the memory means 48 and the electrical connection means 49 are arranged in the card holder 22 in this embodiment, but at least one of them may be provided on the upper surface of the probe card 21. The memory means 48 includes of two random access memory (ROM) elements 48a, and preferably, each should employ an electrically-erasable-programmable-read-only-memory (EEPROM). In one of the ROMs 48, all the information on the probe card 21, which was written before an examination is stored, whereas in the other, all the information on the probe card 21, which was rewritten after the examination is stored. Besides the data of the Z direction movement, which controls the movement of the table 13 in the Z direction, the information includes, for example, the number of times of contact (total and per trip), the relative position of the needles, the serial number of a probe card, the type of a probe card, the number of pins, the number of multi-numbers, the multi-levels, the timing of execution of the examination of the needles/the number of times of contact, the overdrive allowance value, execution of slide after contact, execution of examination of the needles, execution of alarming and rejection in case of no-good probe card. The Z direction movement data includes a distance or level Hh by which the semiconductor-wafer-placed-chuck 32 is lifted at a high speed, and a limit level at which the chuck 32 is stopped when it has been lifted by a predetermined distance or up to a predetermined level. Before examining a semiconductor device or element, the chuck 32 is moved upward at a high speed up to the predetermined level Hh, which is close, for example 4 mm, to the probe card 21, and then at a slow speed until a level H1 (contact point) at which the probe needles 47 touch on the terminals of the semiconductor element, is detected, as described in connection with the prior art technique. In reality, in order to further assure the electrical connection between the probe needles 47 and the electrical pads of the semiconductor device, the upward movement is stopped at a point a little higher than the contact point (overdrive). The limit level H can be defined as:

H=distance wafer moved at high speed Hh
+distance wafer moved at low speed H1
+allowable distance ΔH In the case where no contact point is detected after a semiconductor wafer is moved by the predetermined distance H, which indicates an error in the semiconductor wafer 12 or the assembly 23, the detection of the contact point must be stopped. The assemblies 23 from each other in high speed distance Hh (or distance a wafer is moved at a high speed), and each Hh value should be set as close as to the distance between the upper surface of a semiconductor wafer 12 and the tips of probe needles 47 for the purpose of shortening the operation time. However, if the Hh value is exceeds the actual distance, the semiconductor wafer 12 and the probe needles 47 are likely to collide with each other at a high speed, causing damage to one or both of them. In order to avoid such collision, each Hh value is set to include a clearance in consideration of inevitable production errors of the semiconductor wafer 12 and the assembly 23. In this embodiment, Hh is set at about 20 mm, and Hi is at 3 to 4 mm.

The electrical connection means 49 has a number of contact holes, and is electrically connected to the memory means 48. The connection means 49 is also electrically connected to the print substrate 40a of the insert ring 40, and as the assembly 23 is set to the determined position, the contact pins projecting from the lower surface of the insert ring 40 are electrically connected to the contact holes. Thus, the assembly 23 is fit in the main body 10, and the memory means 48 is electrically connected to the control system 44.

The control system 44 includes a CPU 50 to which the memory means is connected, as can be seen in FIG. 7. The control system 44 also includes a Z direction movement control circuit 51, an X-Y direction movement control circuit 52, a θ direction movement control circuit 53, all connected to the CPU. These movement control circuits 51, 52, and 53 are, respectively, connected to the lifting mechanism 54 for moving the table 13, shown in FIG. 4, the driving mechanism 55, and the rotating mechanism 56. With this structure, the CPU 50 manipulates all of the memory means 48, Z direction movement control device 51, X-Y direction movement circuit 52, and θ direction movement control circuit 53 to operate with each other as will be explained later.

Figure 8:
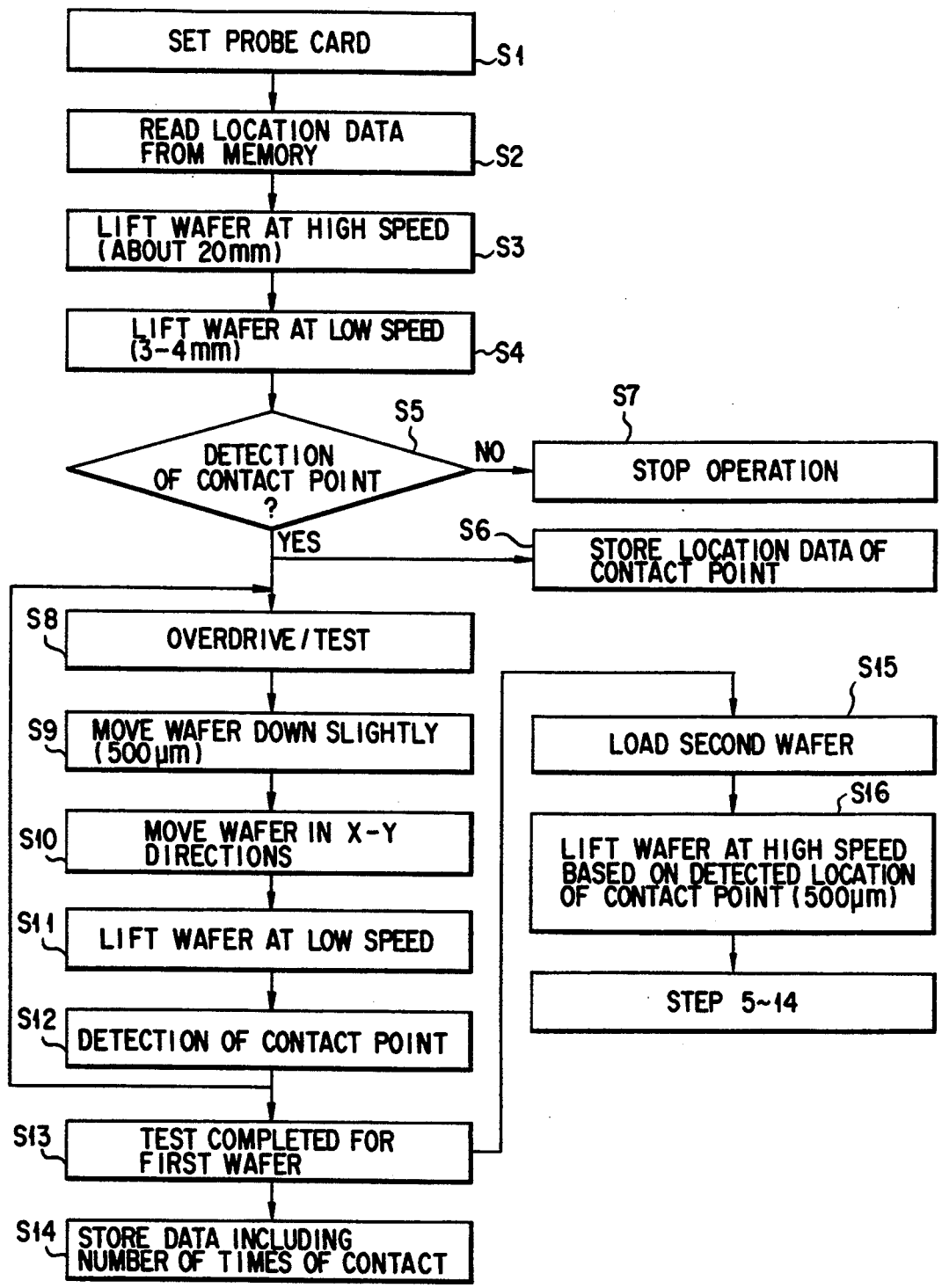
FIG. 8 is a flow chart showing the procedure of examination of a wafer under control of the control mechanism shown in FIG. 7.

The main drive control of the table 13 by the control system 44 will now be explained with reference to FIGS. 8 and 9. An assembly 23 is conveyed from the probe card exchanger 16 to a position below the insert ring 40 by means of a convey mechanism (not shown). Then, the support ring 45 is lifted to interpose the assembly 23 between the insert ring and itself, and thus the probe card 21 is set in the main body 10 (S1). As the probe card 21 is set therein, the memory means 48 of the assembly 23 is connected to the control system 44 via the print substrate 40a of the insert ring 40, and the probe needles 47 is connected to the tester via the contact ring 41 and test head 42. Thus, the high speed distance data (about 20 mm) stored in the memory means 48 is input to the CPU 50 (S2). After that (in some cases, before that), the first semiconductor wafer 12 is conveyed onto the chuck 32 by means of the autoloader 15, and alignment of the wafer in terms of directions X and Y and angle θ, is performed so as to set a semiconductor wafer or wafers to be checked first, at an accurate position underneath the contact ring 41. Then, in accordance with the data read out in the step S2, the CPU 54 instructs the Z direction movement control circuit 51 to drive the lifting mechanism 54, and the chuck 32 which holding the semiconductor wafer 12 is lifted by the high speed distance Hh (about 20 mm) at a high speed (10 mm/min to 20 mm/min) toward the tip ends of the probe needles 47 of the probe card 21 (S3). The chuck 32 is further lifted at a low speed (500 μm/sec) (S4), and in normal cases, the contact point is detected when the chick is moved up about 3 to 4 mm (S5). The level data of this contact point is stored in the memory (second memory means) of the CPU 50 (S6). In other words, the level data of the probe card 21 presently used is stored in the control system 44. The contact point detection method employed here is similar to that of the prior art technique, and the detection is based on a current flow which occurs when an electrode pad of a semiconductor element is brought into electrical contact with the probe needles 47. When the chuck 32 is lifted by the limit distance stored in the memory means 48, the control system 44 transmits an error signal to the z direction movement control circuit 51 to stop the movement of the lifting mechanism 64 (S7). When, the contact point is detected, the chuck 32 is lifted about 50 & L m at a low speed so as to further assure the electrical contact between the electrical pad and the probe needles 47. While the pad and needles being in contact with each other, the electrical data is output from the electrical pad to the tester 43 via the probe needles 47, and thus the electrical characteristics of the semiconductor element are examined. After the examination, the chuck 32 is brought down by a small distance (about 500 μm) at a low speed to move the probe needles 47 away from the contact point (S9). Then, in accordance with the data stored in the memory means 48, or the data already stored in the CPU 50, the semiconductor wafer 12 is moved in the X and Y directions by means of the X-Y direction movement control circuit 52 and the drive mechanism 55 so that a semiconductor element to be examined next is located right underneath the probe needles 47 by the table 13 (S10). The chuck 32 is then lifted at substantially the same low speed (S11), and detection of the contact point is carried out (S12). The semiconductor element is thus examined. A set of these steps (S8 to S12) is repeated until examination of all the semiconductor elements formed on one piece of semiconductor wafer 12 is completed (S13), and necessary data including the number of times of contact are stored in the memory means 48 via the CPU 50. After examination, this semiconductor wafer 12 is conveyed to the autoloader 15, and the next semiconductor wafer 12 is brought onto the chuck 32, where alignment of the wafer in terms of the directions X and Y, and angle θ, is performed as in the last time (S15). In accordance with the contact point data stored in the step S6, the high speed distance Hh is corrected to a new value, which is higher than the previous one, and is a little below (about 500 μm) the contact point. More specifically, suppose the high speed distance Hh of the first semiconductor wafer 12 is 20 mm, and the low speed distance between the level Hh and the contact point is 3 mm. In this case, the new high speed distance is set to 20 mm+(3 mm to 500 μm). Based on this new set value, the chuck 32 is lifted up to the position which is only 500 μm below the contact point at the same high speed (S16), and then at the same low speed to carry out detection of the contact point (S17). After that, the steps S5-S14 are repeated, where the examination of the second semiconductor wafer 12 is carried out in a similar manner. From the second semiconductor wafer on, the examination of a wafer can be carried out based on the level data of the contact point obtained from the first semiconductor wafer 12, and this level data may be maintained through the course of examinations, or may be rewritten from one wafer to another.

By making the assembly 23 having the memory means 48 and the control system 44 correlate with each other, the high speed movement distance of each of the semiconductor wafers from the second one on can be set longer than the previous (first) one, but within a limit at which the semiconductor wafer 12 and the probe needles 47 never collide with each other, based on the measured level of the contact point for the first semiconductor wafer examined.

Figure 9:
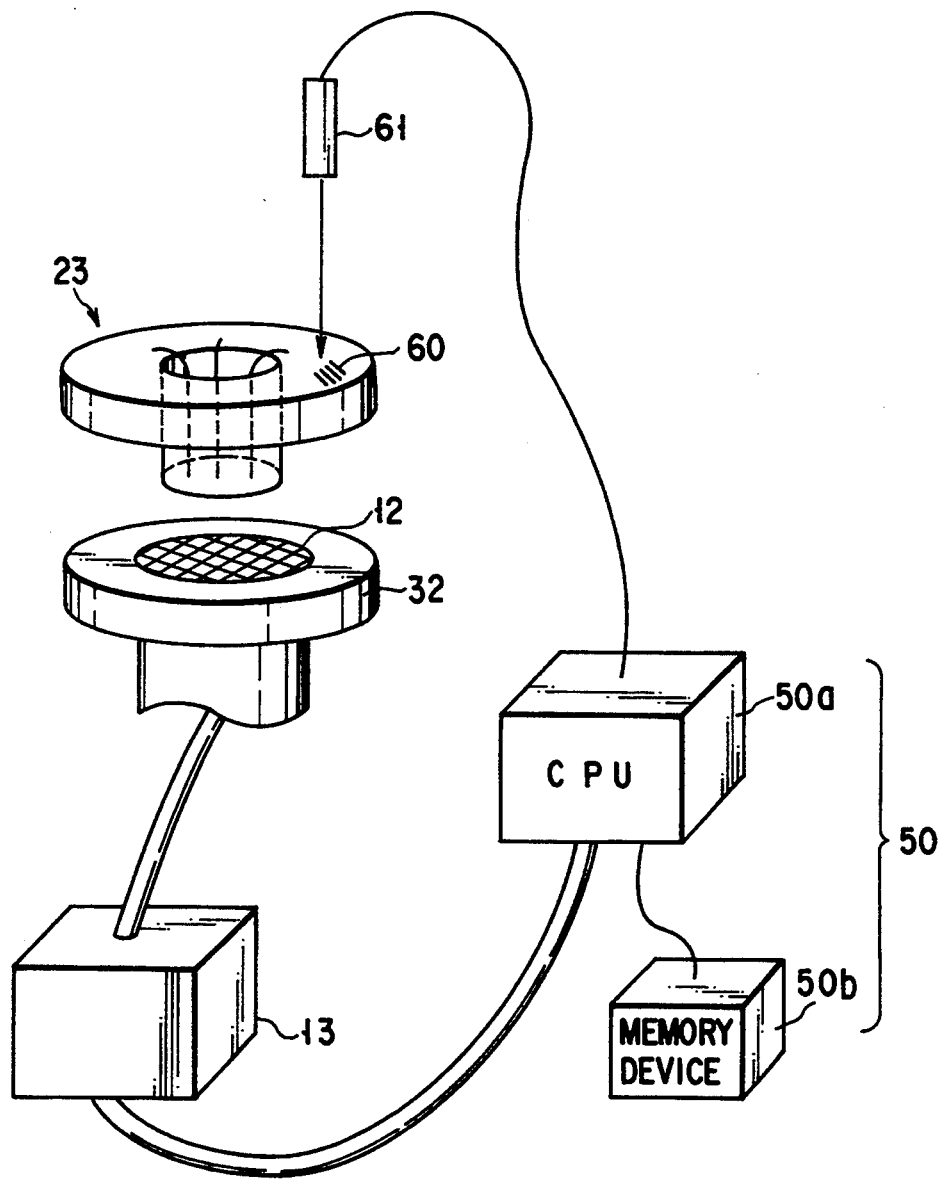
FIGS. 9 and 10 are sketches each showing a probe apparatus according to other embodiments.

FIG. 9 is a schematic view of a structure of a probe apparatus according to another embodiment of the invention. In this figure, the same structural elements as those shown in the previous embodiment are designated by the same reference numerals. In this embodiment, for the purpose of identification, an indication marking, for example, bar code 60, is provided on an assembly 23, and a bar code reader 61 is provided for the probe apparatus for identifying the indication marking by reading the bar code 60. Further, the probe apparatus includes, in addition to a CPU 50a, a memory device 50b for storing data with regard to a probe card identified by its indication remarking in the form of bar code 60. In this memory device 50b, data regarding a probe card specified by its indication marking, is stored, and such data contains at least the data regarding the level of the probe needles.

The operation of the probe apparatus having the above-described structure is carried out in the following manner. First, the bar code reader 61 reads the bar code 60 on an assembly 23. From this bar code, the CPU 50b identifies the probe card. The CPU then reads out the data regarding the level of the corresponding probe needles from the memory device 50b to find an approximate level of the tips of the probe needles, and controls the vertical movement of the chuck 32 as in the aforementioned embodiment. This embodiment can exhibit an effect very similar to that of the aforementioned one. It should be added here that as an indication marking for identification, an ASCII code and character reading mechanism or the like may be used in place of the bar code 60 and bar code reader 31.

Figure 10:
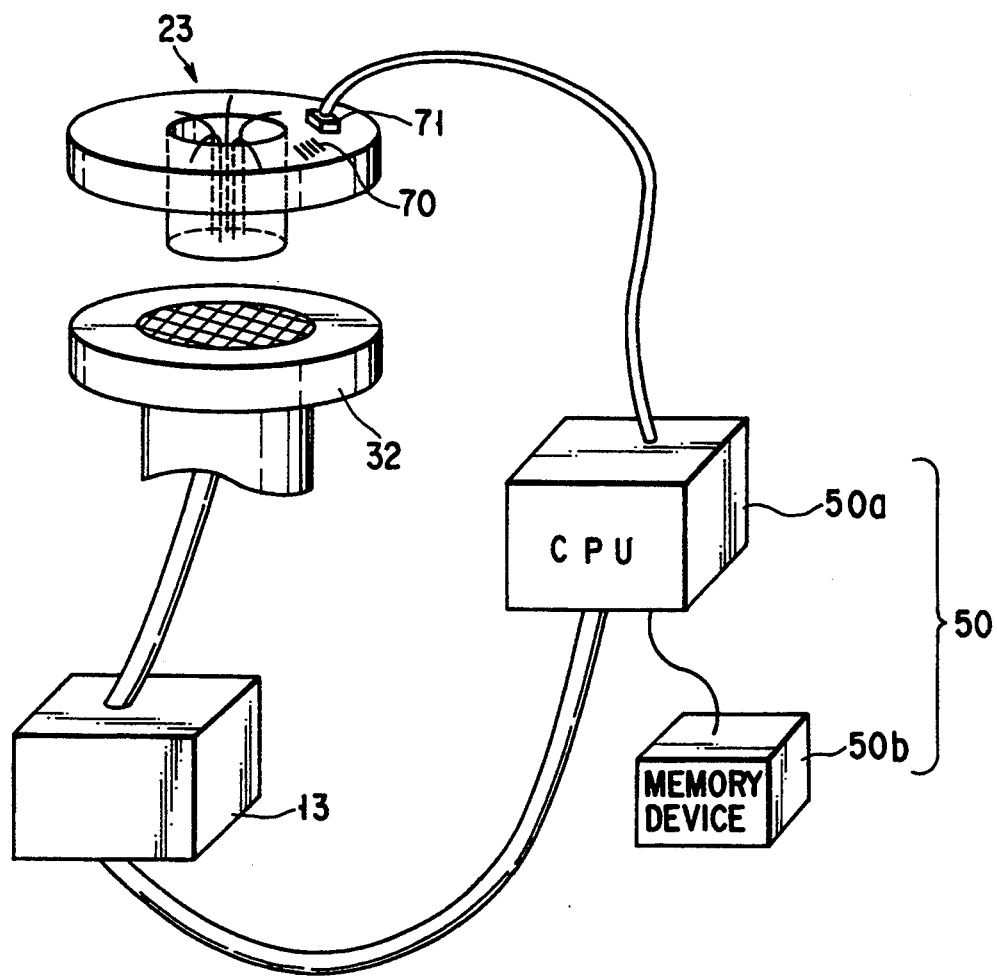

FIG. 10 shows an embodiment in which a jumper cable 70 is provided on a probe card as an indication marking for identification. As shown in this figure, a number of jumper cables 70 are provided on an assembly 23, and an assembly is identified by a combination of open and short states of the jumper cables 70. Further, the probe apparatus has a detection mechanism 71 for detecting the state of the jumper cables 70 on an assembly. From a memory device 50b, the CPU 50a reads out the data with regard to the level of the probe needles corresponding to the detected assembly, which is identified by the state of the jumper cables. Thus, an approximate level of the tips of the probe needles is detected, and based on the detection, the vertical movement of the chuck 32 is controlled as in the previous embodiment. This embodiment also exhibits an effect similar to the previous one.

It should be noted that the essence of providing an indication marking on a probe card is to identify the card, and therefore as long as identification of a probe card can be performed, any means will do, including those operating on the basis of a combination of transmission and reflection light, or combination of characters, numbers, symbols, etc. Further, the memory device 50b may contain, besides the data regarding the level of the probe needles of each probe card, other kind of data on the probe card, and based on such data, other kind of control is possible.

As described, according to the probe apparatus of the present invention, collision between an object and probe needles can be avoided, and thus damages to the object, probe card, and the like can be prevented.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A probe apparatus comprising:
    probe card means including probe needles, and a memory element containing data of the level of the probe needles, representing the distance between the probe card means and an object to be probed;
    means for supporting said object underneath said probe card means, and for vertically moving said object; and
    controlling means connectable to the memory element for attaining a level of the probe needles of said probe card means based on data read out from the memory element of said probe card means, for driving said supporting and moving means such that said object approaches tips of said probe needles in accordance with a distance therebetween to bring said object into contact with said probe needles, and for updating the data in the memory element based on the distance between the wafer and the probe needles to increase testing speed.

2. A probe apparatus comprising:

probe card means including probe needles, and a memory element containing data of level of said probe needles, representing the distance between the probe card means and a wafer to be probed;

means for supporting the wafer containing at least one semiconductor device having a plurality of electrode pads, and for vertically moving said wafer; and controlling means connectable to the memory element for attaining a level of the probe needles of said probe card means based on data read out from the memory element of said probe card means, for driving said supporting and moving means based on the data in the memory element first at a high speed then at a low speed such that said electrode pads of said wafer approach tips of said probe needles in accordance with a distance therebetween to bring said electrode pads into contact with said probe needles, and for updating the data in the memory element based on the distance between the wafer and the probe needles to increase testing speed.

3. A probe apparatus comprising:

probe card means including probe needles and a first memory means containing data of a level of said probe needles, representing the distance between the probe card means and an object to be probed;

supporting means provided underneath said probe card means, for supporting a wafer containing at least one semiconductor device having a plurality of electrode pads, at an initial position;

driving means for vertically moving said supporting means;

controlling means connectable to the memory element for attaining a level of the probe needles of said probe card means based on data read out from the memory element of said probe card means, and for driving said supporting means by a first distance at a high speed then by a second distance at a low speed such that said electrode pads approach said probe needles to bring said electrode pads into contact with said probe needles at a contact point;

second memory means for detecting a level of the contact point of the wafer first detected, and for storing data of said level of the contact point; and means for examining said at least one semiconductor element via said probe needles brought into contact with said electrode pads;

said driving means further comprising:
means for returning said supporting means which have been supporting said wafer with which examination of said semiconductor is finished, to said initial position; and means for removing said wafer with which the examination is finished, from the supporting means returned to said initial position, and placing a wafer to be examined next onto said supporting means said controlling means controls said driving means based on the data of the level of the contact point stored in said second memory means, to move said supporting means toward the probe needles by said second distance, which is longer than said first distance, at the high speed.

4. A probe apparatus according to claim 3, wherein said probe card means further comprises: first contact means electrically connected to said first memory means; a contact ring detachably supporting said probe card means; and second contact means provided on said contact ring and electrically connected to said control means, whereby being connected to said first contact means when said probe card means is set to said contact ring.

5. A probe apparatus comprising:
a probe card including a plurality of probe needles;
a card holder for supporting said probe card;
means for supporting an object movably in a vertical direction;
a contact ring for supporting said card holder detachably above said supporting means; and
a ROM built in said card holder, and containing data on a distance between said probe needles and said supporting means.

6. In a probe apparatus comprising identification means for identifying an indication marking provided on a probe card, and memory means for storing data regarding said probe card identified by said indication marking, the improvement in which,
said probe apparatus reads out data of said probe card having said indication marking identified by said identification means, from said memory means to attain a level of probe needles of said probe card, and drives an object such that said object approaches tips of said probe needles in accordance with a distance therebetween, to prevent collision between said object and said probe needles.

7. A probe apparatus comprising:
a probe card having probe needles;
a programmable memory device positioned on the probe card for storing data which represents the distance between tips of the probe needles and a semiconductor wafer;
means for supporting the wafer;
controlling means for driving together the supporting means and the probe card at a sufficiently high speed then at a sufficiently low speed such that the probe needles and wafer do not collide in accordance with the distance data representing the distance between the probe needles and the wafer, and for updating the memory device in accordance with the distance between the probe needles and the wafer.

8. A probe apparatus according to claim 7, further comprising:
means for automatically exchanging the probe card with a different probe card; and
means for automatically exchanging the wafer with a different water.

9. A method for probing a semiconductor wafer, avoiding collision between probe and semiconductor wafer, comprising the steps of:
programming a memory device positioned on a probe card with data representing the distance between probe needles on the probe card and the semiconductor wafer;

setting the probe card and wafer in a position adjacent to one another;
electronically reading the distance data from the memory device;
advancing the wafer toward the probe card at a sufficiently high speed then at a sufficiently low speed;
automatically detecting the point where the probe needles contact the wafer;
stopping the wafer from advancing toward the probe card after the probe needles contact the wafer; and
updating the memory device by storing contact point data.

10. A method for probing a semiconductor wafer according to claim 9, further comprising the steps of:
withdrawing the wafer from the probe after contact;
moving the wafer in a plane parallel with the probe to align the probe needles with probe points on the wafer; and
advancing the wafer toward the probe to make a contact between the probe needles and the probe points.

11. A method for probing a semiconductor wafer according to claim 9, further comprising the steps of:
automatically exchanging the probe card with a different probe card; and
automatically exchanging the wafer with a different wafer.

* * * * *